United States Patent
Lin et al.

(10) Patent No.: US 10,490,275 B2
(45) Date of Patent: Nov. 26, 2019

(54) RESISTIVE MEMORY STORAGE APPARATUS AND WRITING METHOD THEREOF INCLUDING DISTURBANCE VOLTAGE

(71) Applicant: Winbond Electronics Corp., Taichung (TW)

(72) Inventors: Lih-Wei Lin, Taichung (TW); Ju-Chieh Cheng, Taichung (TW); Tsung-Huan Tsai, Taichung (TW); I-Hsien Tseng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/048,350

(22) Filed: Jul. 30, 2018

(65) Prior Publication Data
US 2019/0057738 A1 Feb. 21, 2019

(30) Foreign Application Priority Data
Aug. 16, 2017 (CN) .......................... 2017 1 0700423

(51) Int. Cl.
*G11C 13/00* (2006.01)
(52) U.S. Cl.
CPC ...... *G11C 13/0069* (2013.01); *G11C 13/0007* (2013.01); *G11C 13/0064* (2013.01); *G11C 13/0097* (2013.01); *G11C 2013/009* (2013.01); *G11C 2013/0076* (2013.01)

(58) Field of Classification Search
None
See application file for complete search history.

(56) References Cited

U.S. PATENT DOCUMENTS

| | | | |
|---|---|---|---|
| 9,240,236 B1 | 1/2016 | Barabash et al. | |
| 2004/0264234 A1* | 12/2004 | Moore | G11C 13/0004 365/148 |
| 2009/0290411 A1* | 11/2009 | Xi | G11C 11/5664 365/163 |
| 2010/0271860 A1* | 10/2010 | Muraoka | G11C 13/0007 365/148 |

(Continued)

FOREIGN PATENT DOCUMENTS

| | | |
|---|---|---|
| CN | 102915762 | 2/2013 |
| CN | 104412326 | 3/2015 |

(Continued)

*Primary Examiner* — J. H. Hur
(74) *Attorney, Agent, or Firm* — JCIPRNET

(57) ABSTRACT

A writing method of a resistive memory storage apparatus is provided. The writing method includes: applying a first set voltage on a memory cell, and acquiring a first reading current of the memory cell; applying a first disturbance voltage on the memory cell, and acquiring a second reading current of the memory cell; and determining to apply a second set voltage or a second disturbance voltage on the memory cell according to a magnitude relationship between the first reading current and the second reading current. An absolute value of the first disturbance voltage is smaller than an absolute value of a reset voltage, and an absolute value of the second disturbance voltage is smaller than an absolute value of the second set voltage. In addition, a resistive memory storage apparatus is also provided.

18 Claims, 7 Drawing Sheets

(56) References Cited

U.S. PATENT DOCUMENTS

| | | | |
|---|---|---|---|
| 2011/0128773 A1* | 6/2011 | Azuma | G11C 13/0007 365/148 |
| 2011/0176351 A1* | 7/2011 | Fujitsuka | G11C 11/5685 365/148 |
| 2013/0044534 A1* | 2/2013 | Kawai | G11C 13/0007 365/148 |
| 2013/0094275 A1* | 4/2013 | Chen | G11C 11/00 365/148 |
| 2013/0094276 A1* | 4/2013 | Torsi | G11C 13/0004 365/148 |
| 2013/0107605 A1* | 5/2013 | Chen | G11C 13/0002 365/148 |
| 2014/0233299 A1* | 8/2014 | Lan | G11C 13/0064 365/148 |
| 2016/0211020 A1* | 7/2016 | Hsu | G11C 13/0097 |

FOREIGN PATENT DOCUMENTS

| | | |
|---|---|---|
| JP | 2013048004 | 3/2013 |
| TW | 580707 | 3/2004 |
| TW | I488347 | 6/2015 |
| WO | 2009145308 | 12/2009 |

\* cited by examiner

RESISTIVE MEMORY STORAGE APPARATUS AND WRITING METHOD THEREOF INCLUDING DISTURBANCE VOLTAGE

CROSS-REFERENCE TO RELATED APPLICATION

This application claims the priority benefit of China application serial no. 201710700423.8, filed on Aug. 16, 2017. The entirety of the above-mentioned patent application is hereby incorporated by reference herein and made a part of this specification.

TECHNICAL FIELD

The invention is related to a memory storage apparatus and a writing method thereof, and particularly to a resistive memory storage apparatus and a writing method thereof.

DESCRIPTION OF RELATED ART

Existing resistive memories normally include an upper electrode and a lower electrode configured to be opposite to each other and a dielectric layer disposed between the upper electrode and the lower electrode. When performing a set operation on the existing resistive memory, it is required to perform a filament forming procedure first by applying a positive bias to the resistive memory so that the current flows from the upper electrode to the lower electrode and an oxygen vacancy or oxygen ion can be generated in the dielectric layer to form a current path, thereby forming the filament. In the formed filament, a portion of the diameter adjacent to the upper electrode is larger than a portion of the diameter adjacent to the lower electrode. In addition, when a reset operation is performed on the existing resistive memory, a negative bias is applied to the resistive memory so that the current flows from the lower electrode to the upper electrode. At this point, the oxygen vacancy or oxygen ion adjacent to the lower electrode is separated from the current path such that the filament is isolated adjacent to the lower electrode.

However, in the existing techniques, after the set operation is performed on the existing resistive memory, although a memory cell with low resistance state (LRS) can be obtained and the reading current is large, the large reading current cannot acquire whether the filament of the memory cell with low resistance state is robust enough to pass the high temperature data retention (HTDR) and endurance tests.

SUMMARY OF INVENTION

The invention provides a resistive memory storage apparatus and a writing method thereof, and a filament thereof is robust with good high temperature data retention and good endurance.

In the invention, a writing method of a resistive memory storage apparatus includes applying a first set voltage on a memory cell and acquiring a first reading current of the memory cell; applying a first disturbance voltage on the memory cell and acquiring a second reading current of the memory cell; determining to apply a second set voltage or a second disturbance voltage on the memory cell according to the magnitude relationship between the first reading current and the second reading current. An absolute value of the first disturbance voltage is smaller than an absolute value of the reset voltage, and an absolute value of the second disturbance voltage is smaller than an absolute value of the second set voltage.

In the invention, the resistive memory storage apparatus includes a memory cell array and a memory controlling circuit. The memory cell array includes a memory cell. The memory controlling circuit is coupled to the memory cell array. The memory controlling circuit applies the first set voltage on the memory cell and acquires the first reading current of the memory cell. The memory controlling circuit applies the first disturbance voltage on the memory cell and acquires the second reading current of the memory cell. The memory controlling circuit determines to apply the second set voltage or the second disturbance voltage on the memory cell according to the magnitude relationship between the first reading current and the second reading current. The absolute value of the first disturbance voltage is smaller than the absolute value of the reset voltage, and the absolute value of the second disturbance voltage is smaller than the absolute value of the second set voltage.

In summary, in the exemplary embodiments of the invention, the memory controlling circuit determines to apply the second set voltage or the second disturbance voltage on the memory cell according to the magnitude relationship between the reading currents of the memory cell before/after the first disturbance voltage is applied so as to maintain the high temperature data retention of the memory storage apparatus and optimize the endurance of the memory storage apparatus.

In order to make the aforementioned features and advantages of the invention more comprehensible, embodiments accompanying figures are described in detail below.

DESCRIPTION OF EMBODIMENTS

Figure 1:
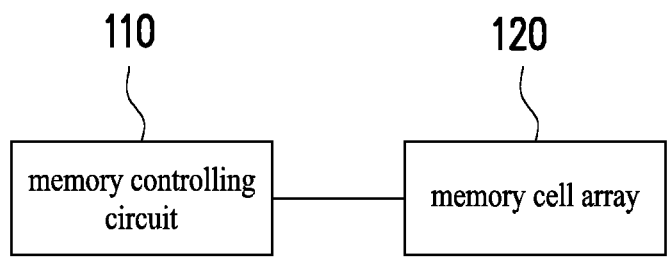
FIG. 1 is a schematic view illustrating a memory storage apparatus according to an embodiment of the invention.
Figure 2:
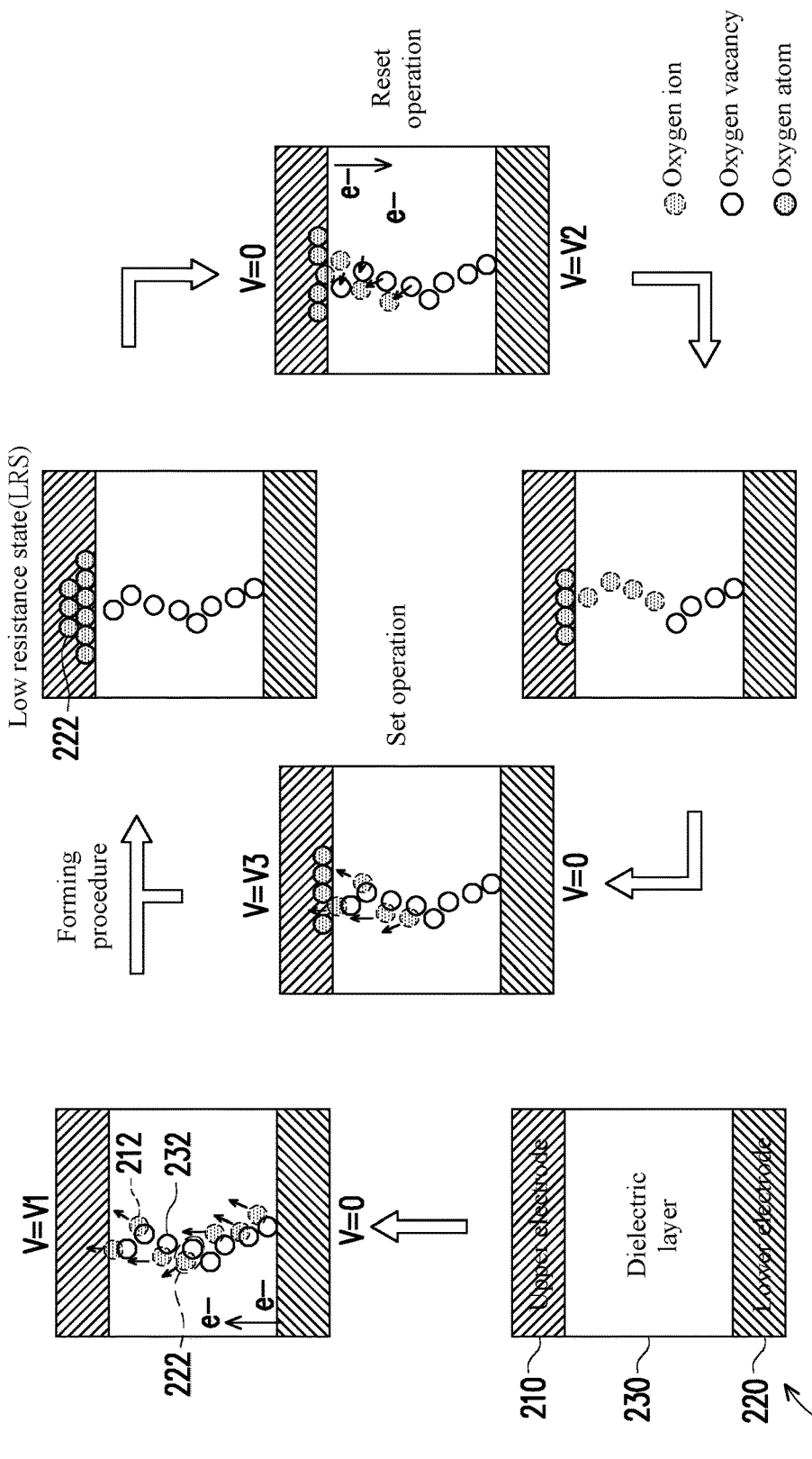
FIG. 2 is a schematic view illustrating a filament in a memory cell undergoing a forming procedure, a reset operation and a set operation according to an embodiment of the invention.

Referring to FIG. 1 and FIG. 2, a memory storage apparatus 100 in the embodiment includes a memory controller 110 and a memory cell array 120. The memory cell array 120 is coupled to the memory controller 110. The memory cell array 120 includes a plurality of memory cells 122 arranged in arrays. In the embodiment, a resistive memory device 122 includes an upper electrode 210, a lower electrode 220 and a dielectric layer 230 disposed between the upper electrode 210 and the lower electrode 220. The dielectric layer 230 includes a dielectric material such as a transition metal oxide (TMO). The memory cell 122 with such structure at least has two resistance states. The resistance state of the resistive memory device 122 is changed by applying different voltages on both ends of the electrode so as to provide the function of storing data.

In the embodiment, the memory controller 110 is used to perform a forming procedure on the memory cell 122. The forming procedure refers to an initialization process performed on the memory cell 122. In the process, a bias V1 (forming voltage) is continuously applied on both ends of the electrode of the memory cell 122 so as to generate an applied electric filed on the dielectric layer 230. In the embodiment, a positive voltage of V1 volt is applied on the upper electrode 210, and a voltage of 0 volt is applied on the lower electrode 220. The applied electric field separates an oxygen atom 222 into an oxygen ion 212 and an oxygen vacancy 232. The oxygen vacancy 232 forms a filament in the dielectric layer 230 as a current transmitting path. When the applied electric filed exceeds a threshold value, the dielectric layer 230 generates a dielectric breakdown phenomenon, and the high resistance state (HRS) is changed into a low resistance state (LRS). The breakdown is not permanent and the resistance value can still be changed.

The memory cell 122 undergoing the forming procedure has a low resistance state. When a reset operation is performed, the upper electrode 210 of the memory cell 122 is applied with the voltage of 0 volt, and the lower electrode 220 is applied with a positive voltage with V2 volt. The voltage difference is a reset voltage such as −V2 volt. The state of the memory cell 122 that undergoes the reset operation is changed from the low resistance state into the high resistance state. Thereafter, when a set operation is performed, the upper electrode 210 of the memory cell 122 is applied with a positive voltage of V3 volt, and the lower electrode 220 is applied with the voltage of 0 volt. The voltage difference is a set voltage such as +V3 volt. The state of the memory cell 122 that undergoes the set operation is changed from the high resistance state into the low resistance state. In the embodiment, the magnitude and polarity of the reset voltage and the set voltage are described in an exemplary sense and should not be construed as a limitation to the invention. In the embodiment, the forming procedure, the reset operation and the set operation depicted in FIG. 2 are exemplarily described as an example, and the invention is not limited thereto.

On the other hand, in terms of reliability test and commercialization, the high temperature data retention and endurance of the memory storage apparatus 100 are decisive factors. One of the factors that causes loss of the high temperature data retention of the memory storage apparatus 100 is that the oxygen ion 212 floats from an electrode layer (e.g., the upper electrode 210) to the dielectric layer 230 and combined with the oxygen vacancy 232 again, which is likely to block the current transmitting path in the dielectric layer 230 and causes the filament therein to break.

Figure 3C:
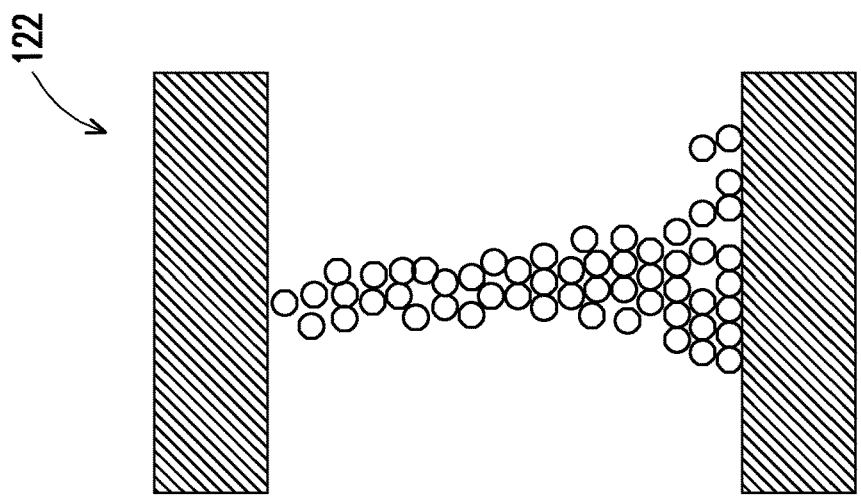
FIG. 3C is a schematic view illustrating a filament in a memory cell according to an embodiment of the invention.
Figure 3B:
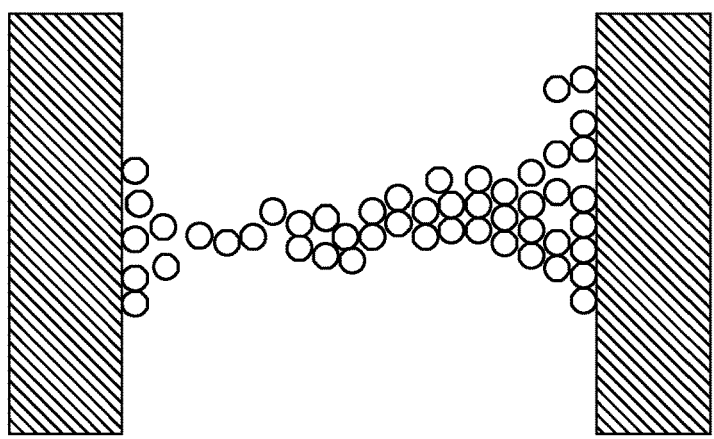
FIG. 3A and FIG. 3B are schematic views illustrating a filament in a memory cell according to a related example of the invention.
Figure 3A:
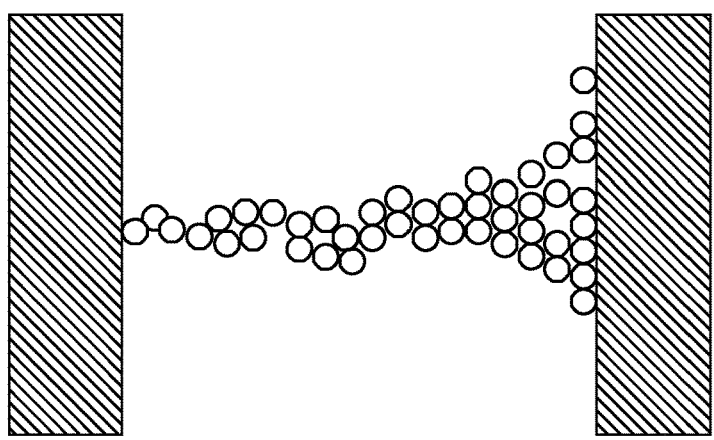

All of the three types of filament models illustrated in FIG. 3A to FIG. 3C represent that the memory cell has low resistance state, and the cell current of them are likely to be larger than a predetermined current value and equal to each other during actual measurement. Therefore, the quality cannot be determined merely based on the magnitude of cell current value of the memory cell. For example, the filament of the memory cell in FIG. 3A and FIG. 3B are too weak to pass the high temperature data retention and endurance tests. The filament of the memory cell in FIG. 3C is robust enough with high reliability and thus a better low resistance filament model.

Figure 4:
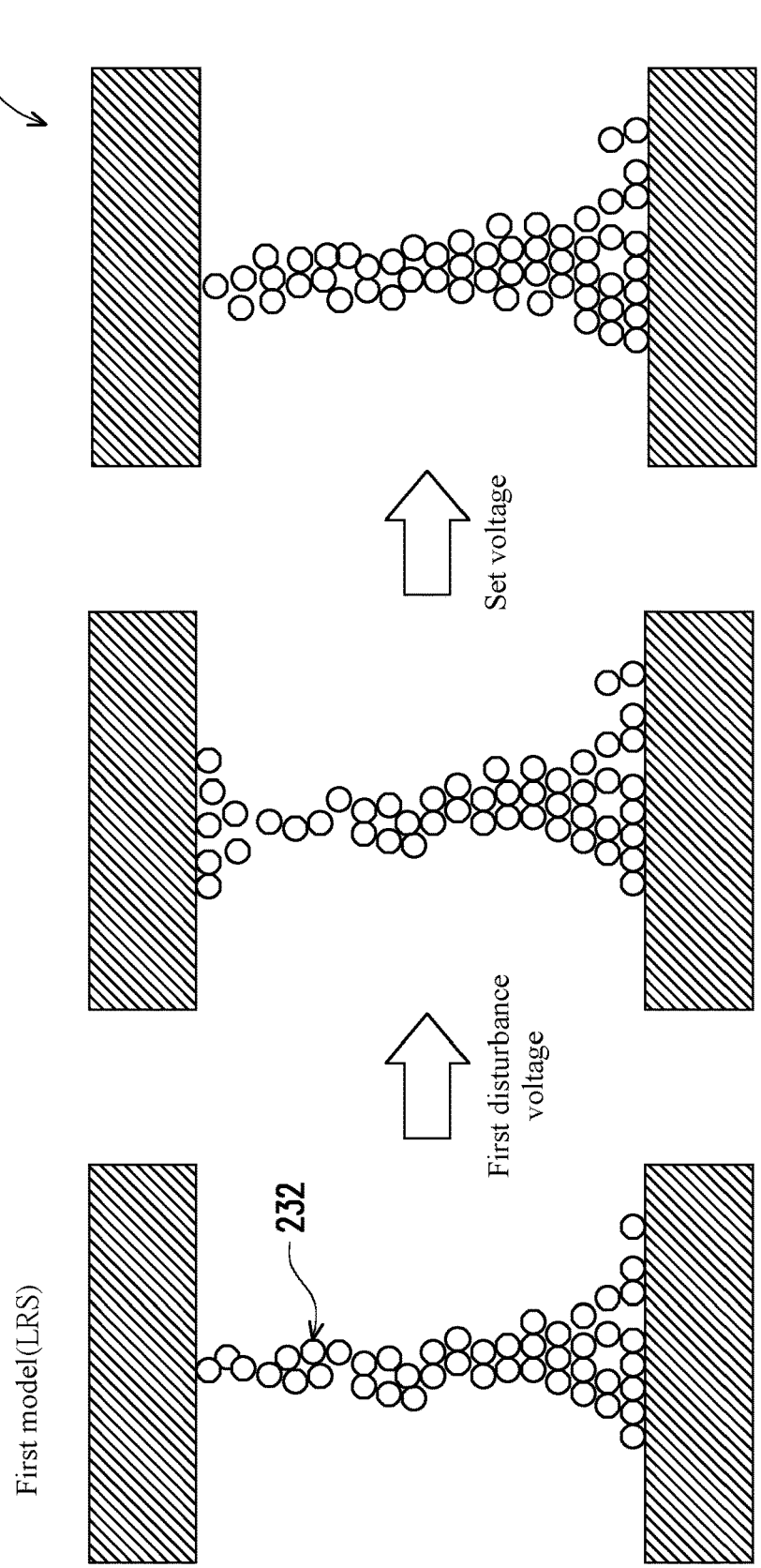
FIG. 4 is a schematic view illustrating how the form of a filament changes in a memory cell when being applied with a first disturbance voltage and a set voltage according to another embodiment of the invention.

Referring to FIG. 4, the initial state of the memory cell 122 of the embodiment before being applied with disturbance voltage is, for example, a first model, and the resistance thereof is larger than the resistance of the memory cell 122 after being applied with the disturbance voltage. In the embodiment, the absolute value of the disturbance voltage is smaller than the absolute value of the set voltage, and the polarity thereof is different from the set voltage. After the memory cell 122 is applied with the first disturbance voltage, the oxygen vacancy 232 is redistributed and the form of the filament is changed. Thereafter, the memory cell 122 is applied with the set voltage so that the oxygen vacancy 232 is redistributed again. After/Before the set voltage is applied on the memory cell 122, the resistance of the filament are basically the same. In the memory cell 122 that is applied with the set voltage, the filament therein is robust enough and thus a better low resistance filament model. Therefore, in the embodiment, applying the disturbance voltage on the memory cell 122 can make the oxygen vacancy 232 therein to be redistributed such that the filament can be robust enough.

Figure 5:
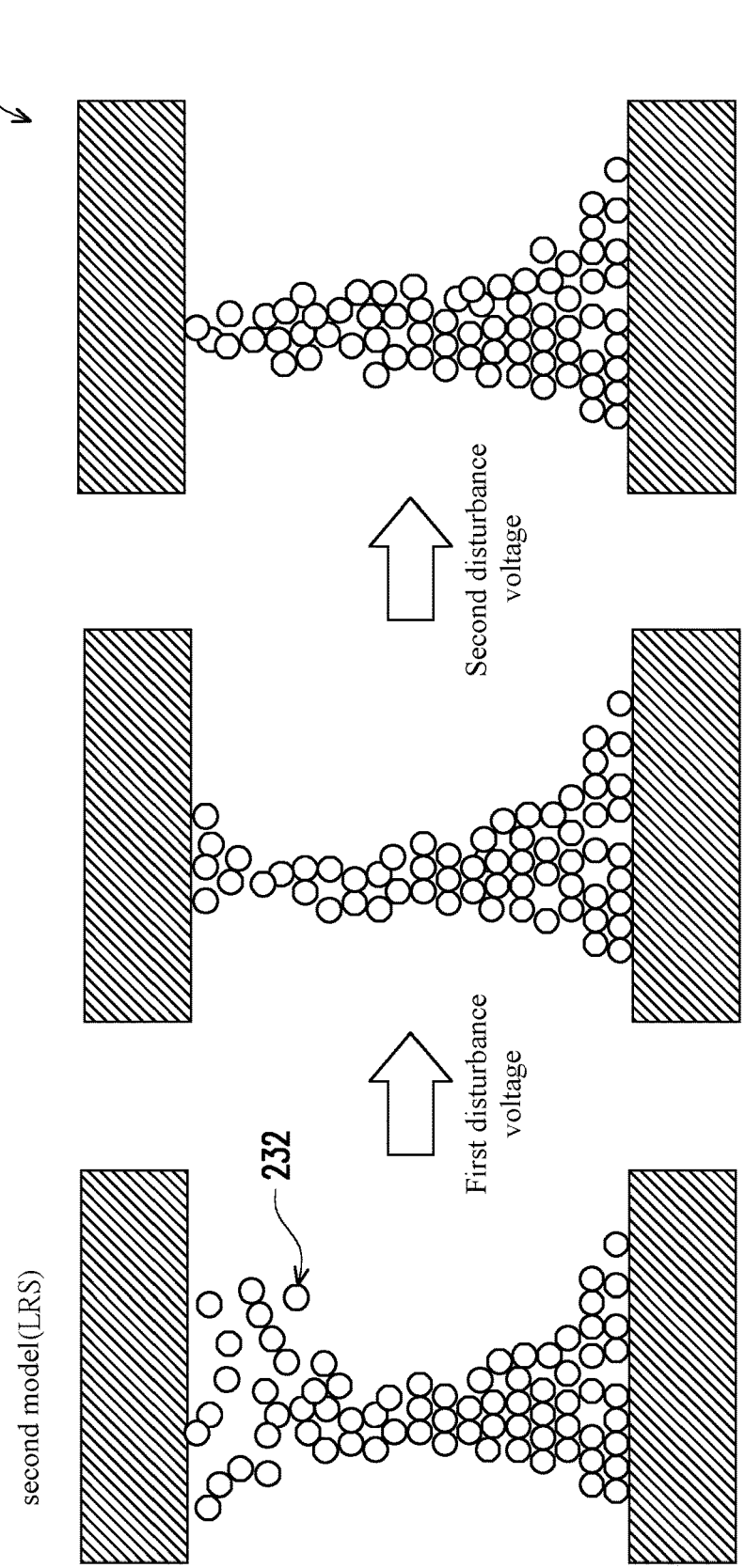
FIG. 5 is a schematic view illustrating how the form of a filament changes in a memory cell when being applied with a first disturbance voltage and a second disturbance voltage according to another embodiment of the invention.

Referring to FIG. 5, an initial state of the memory cell 122 in the embodiment before being applied with the first disturbance voltage is, for example, a second model, wherein the distribution state of the oxygen vacancy 232 is different from the first model. In the embodiment, the absolute value of the first disturbance voltage is smaller than the absolute value of the set voltage, and the polarity thereof is different from the set voltage. After the memory cell 122 is applied with the disturbance voltage, the oxygen vacancy 232 therein is redistributed and the form of the filament is changed. Thereafter, the memory cell 122 is applied with the second disturbance voltage such that the oxygen vacancy 232 is redistributed again. In the memory cell 122 that is applied with the set voltage, the filament therein is robust enough and thus a better low resistance filament model. Therefore, in the embodiment, applying the disturbance voltage on the memory cell 122 can make the oxygen vacancy 232 therein to be redistributed such that the filament can be robust enough.

In the exemplary embodiment of the invention, when using the writing method of the resistive memory storage apparatus to perform the set operation on the memory cell 122, the memory cell 122 is applied with the disturbance voltage, and the reading current of the memory cell before/after application of the disturbance voltage is compared to determine to apply the set voltage or disturbance voltage on the memory cell 122 again. Such writing method helps to maintain the high temperature data retention of the memory storage apparatus 100 and optimize the endurance of the memory storage apparatus 100. A plurality of exemplary embodiments are provided below to describe the writing method of the resistive memory storage apparatus.

Figure 6:
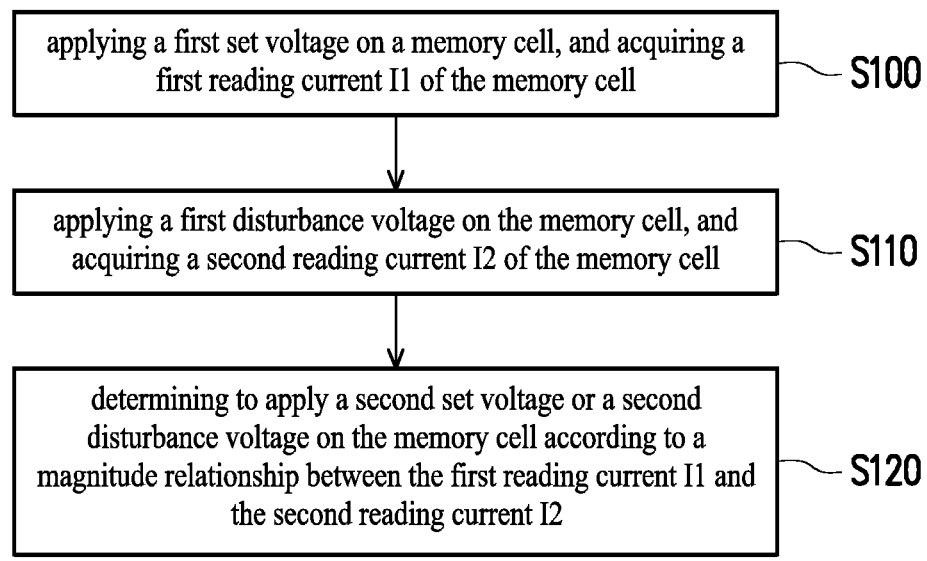
FIG. 6 is a flowchart illustrating steps of a writing method of a memory storage apparatus according to an embodiment of the invention.

Referring to FIG. 1 and FIG. 6, in step S100, the memory controlling circuit 110 applies the first set voltage on the memory cell 122 and acquires a first reading current I1 of the memory cell 122. In the embodiment, the magnitude of the voltage value of the first set voltage is subject to a gate voltage or bit line voltage of the memory cell 122, or subject to a pulse width of the first set voltage. Meanwhile, in the embodiment, one of the method of acquiring the first reading current I1 of the memory cell 122 is, for example, applying reading voltage or verification voltage on the memory cell 122 so as to detect the magnitude of the current value of the memory cell 122.

Next, in step S110, the memory controlling circuit 110 applies the first disturbance voltage on the memory cell 122 and acquires a second reading current I2 of the memory cell 122. The method of acquiring the second reading current I2 is similar to the method of acquiring the first reading current I1 and so forth. In step S120, the memory controlling circuit 110 determines to apply the second set voltage or the second disturbance voltage on the memory cell 122 according to the magnitude relationship between the first reading current I1 and the second reading current I2. For example, if the second reading current I2 is smaller than the first reading current I1, the memory controlling circuit 110 applies the second set voltage on the memory cell 122. If the second reading current I2 is larger than or equal to the first reading current I1, the second disturbance voltage is applied on the memory cell.

In the embodiment, the absolute value of the first disturbance voltage is smaller than the absolute value of the reset voltage, and the voltage polarity of the first disturbance voltage is the same as the voltage polarity of the reset voltage. For example, in step S120, if the memory cell 122 is applied with the positive second set voltage, then in step S110, the memory controlling circuit 110 applies the first disturbance voltage that has smaller absolute value than the reset voltage with the same voltage polarity on the memory cell 122, or which may be referred to as a reverse read disturbance. Generally speaking, the polarity of reset voltage is set to be the same as the polarity of set voltage. On the other hand, in the embodiment, the absolute value of the second disturbance voltage is smaller than the absolute value of the second set voltage, and the voltage polarity of the second disturbance voltage is the same as the voltage polarity of the second set voltage. For example, if the second set voltage is positive voltage, then the second disturbance voltage is a voltage that has smaller absolute value than the second set voltage and the polarity thereof is positive. In the embodiment, the absolute value of the first disturbance voltage and the second disturbance voltage is larger than the threshold voltage that changes the resistance of the memory cell 122. In other words, the first disturbance voltage and the second disturbance voltage can cause disturbance to the oxygen into 212 of the memory cell 122 to change the resistance of the filament without changing the state of the memory cell 122.

Therefore, in the embodiment, when using the writing method of the memory storage apparatus 100 to perform set operation on the memory cell 122, the memory controlling circuit 110 applies the first disturbance voltage on the memory cell 122, and determine to apply the second set voltage or the second disturbance voltage on the memory cell 122 according to the magnitude relationship between the reading current of the memory cell 122 before/after the first disturbance voltage is applied. Such writing method helps to maintain the high temperature data retention of the memory storage apparatus 100 and optimize endurance of the memory storage apparatus 100.

In the embodiment, the writing method of the memory storage apparatus 100 may be used to detect whether the filament of the memory cell 122 is robust. For example, after the first disturbance voltage is applied, if the reading currents of the memory cell 122 before/after the first disturbance voltage is applied are inconsistent with the predetermined relationship, it represents that the filament of the memory cell 122 is not robust enough. In the subsequent set operation, the memory controlling circuit 100 may apply the second disturbance voltage on the memory cell 122 such that the oxygen vacancy therein is redistributed again to make the filament robust.

Figure 7:
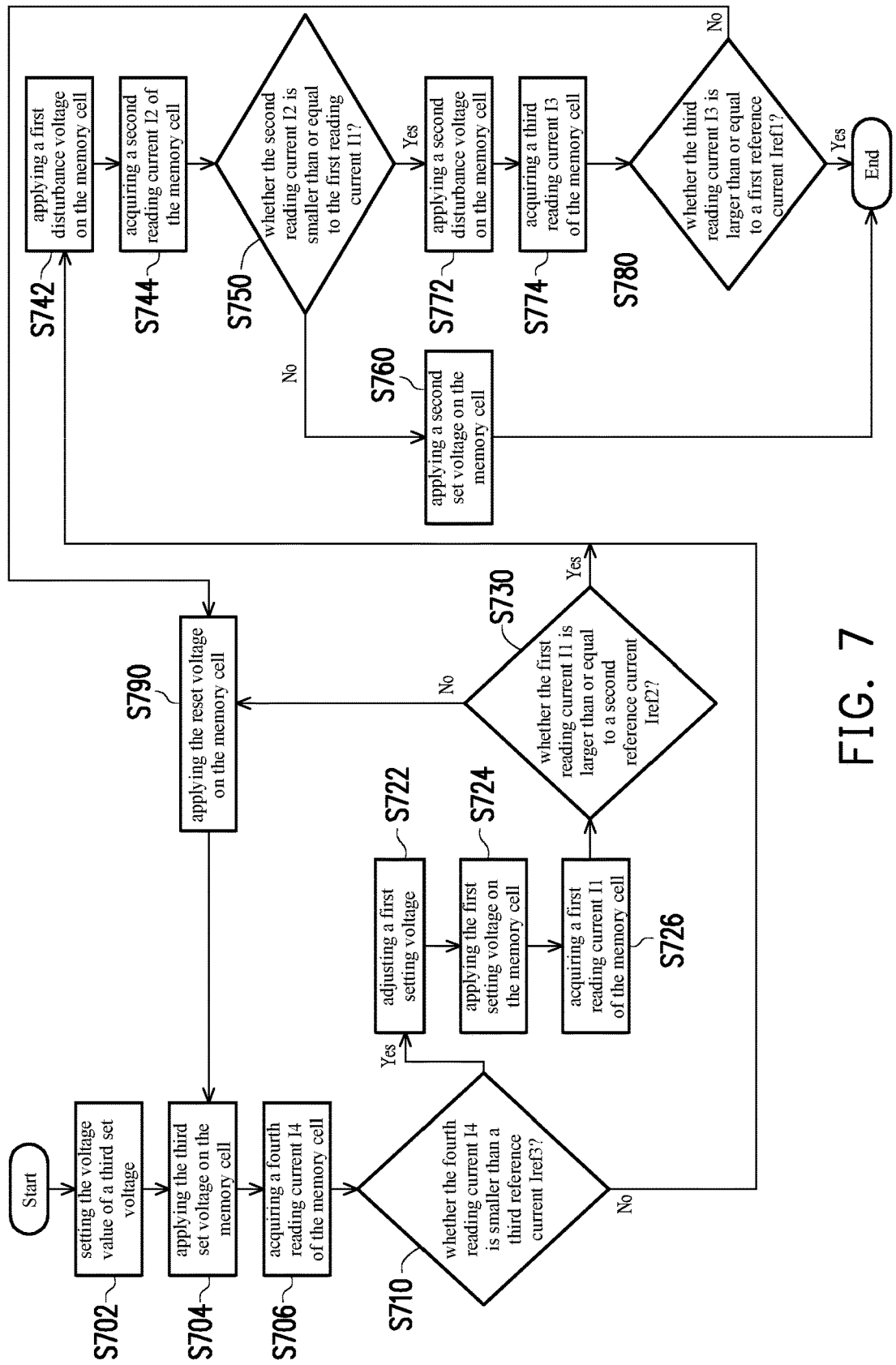
FIG. 7 is a flowchart illustrating steps of a writing method of a memory storage apparatus according to another embodiment of the invention.

Referring to FIG. 1 and FIG. 7, in the embodiment, in step S702, the memory controlling circuit 110 sets the voltage value of a third set voltage. The magnitude of the voltage value of the third set voltage is, for example, determined according to the gate voltage or bit line voltage of the memory cell 122, or according to the pulse width of the third set voltage. Thereafter, in step S704, the memory controlling circuit 110 applies the third set voltage on the memory cell 122. In step S706, the memory controlling circuit 110 acquires a fourth reading current I4 of the memory cell 122. The method of acquiring the fourth reading current I4 is similar to the method of acquiring the first reading current I1 and so forth.

In step S710, the memory controlling circuit 110 determines whether the fourth reading current I4 is smaller than a third reference current Iref3, and determines to apply the first disturbance voltage or adjust the first set voltage on the memory cell 122 according to a determination result. In the embodiment, the third reference current Iref3 is, for example, set as 30 microamperes (μA). In the embodiment, if the fourth reading current I4 is smaller than the third reference current Iref3 (i.e., I4<Iref3), it represents that set is insufficient, and it is required that the memory controlling circuit 110 performs step S722 again. If the fourth reading current I4 is larger than or equal to the third reference current Iref3, the memory controlling circuit 110 performs step S742.

In step S722, the memory controlling circuit 110 adjusts the first set voltage. In the embodiment, one of the methods for the memory controlling circuit 110 to adjust the first set voltage is, for example, stepping the first set voltage. Then, in step S724, the memory controlling circuit 110 applies the first set voltage on the memory cell 122; in step S726, the first reading current I1 of the memory cell 122 is acquired.

In step S730, the memory controlling circuit 110 determines whether the first reading current I1 is larger than or equal to a second reference current Iref2, and determines to apply the first disturbance voltage or reset voltage on the memory cell 122 according to the determination result. In the embodiment, the second reference current Iref2 is, for example, set as 30 microamperes, and such value should not be construed as a limitation to the invention. The current value of the second reference current Iref2 may be the same as or different from the current value of the third reference current Iref3. In the embodiment, if the first reading current I1 is smaller than the second reference current Iref2 (i.e., I1<Iref2), the memory controlling circuit 110 performs step S790. If the first reading current I1 is larger than or equal to the second reference current Iref2 (i.e., I1≥Iref2), it represents that the set achieves the object; then the memory controlling circuit 110 performs step S742, and the first disturbance voltage is applied on the memory cell 122.

In step S790, the memory controlling circuit 110 applies the reset voltage on the memory cell 122 and then performs step S704 to apply the third set voltage on the memory cell 122 again to perform the set operation on the memory cell 122 again.

In step S742, the memory controlling circuit 110 applies the first disturbance voltage on the memory cell 122, and acquires the second reading current I2 of the memory cell 122 in step S744. In step S750, the memory controlling circuit 110 determines to apply the second set voltage or the second disturbance voltage on the memory cell 122 according to the magnitude relationship between the first reading current I1 and the second reading current I2. In the embodiment, if the second reading current I2 is smaller than the first reading current I1 (i.e., I2<I1), it represents that the state of the filament of the memory cell 122 is, for example, as shown in FIG. 3C, then the memory controlling circuit 110 performs step S760 to apply the second set voltage on the memory cell 122 and ends the writing method. If the second reading current I2 is larger than or equal to the first reading current I1 (i.e., I2≥I1), then the memory controlling circuit 110 performs step S772 to apply the second disturbance voltage on the memory cell 122.

In step S772, the memory controlling circuit 110 applies the second disturbance voltage on the memory cell 122, and acquires a third reading current I3 of the memory cell 122 in step S774. In step S780, the memory controlling circuit 110 determines whether the third reading current I3 is larger than or equal to a first reference current Iref1, and determines whether to end the writing method or apply the reset voltage on the memory cell 122 according to the determination result. In the embodiment, the first reference current Iref1 is, for example, set as 30 microamperes, and the value should not be construed as a limitation to the invention. The current value of the first reference current Iref1 may be the same as or different from the current value of the second reference current Iref1 or the third reference current Iref3. In the embodiment, if the third reading current I3 is larger than or equal to the first reference current Iref1 (i.e., I3≥Iref1), then the memory controlling circuit 110 ends the writing method. If the third reading current I3 is smaller than the first reference current Iref1 (i.e., I3<Iref1), then the memory controlling circuit 110 performs step S790 to apply the reset voltage on the memory cell 122.

In step S790, the memory controlling circuit 110 applies to the reset voltage on the memory cell 122, and then performs step S704 to apply the third set voltage on the memory cell 122 again to perform the set operation on the memory cell 122 again.

In the embodiment, the voltage value and signal waveform of the third set voltages may be smaller than or equal to the first set voltage or equal to the second set voltage. In the embodiment, the voltage polarity of the reset voltage is different from the first set voltage. In the embodiment, the absolute value of the first disturbance voltage is smaller than the absolute value of the reset voltage, and the absolute value of the second disturbance voltage is smaller than the absolute value of the second set voltage. The voltage polarity of the first disturbance voltage is different from the voltage polarity of the second set voltage, and the voltage polarity of the second disturbance voltage is the same as the voltage polarity of the second set voltage. In the embodiment, the absolute value of the first disturbance voltage is smaller than the absolute value of the reset voltage, and the absolute value of the second disturbance voltage is smaller than the absolute value of the second set voltage. The voltage polarity of the first disturbance voltage is the same as the voltage polarity of the reset voltage, and the voltage polarity of the second disturbance voltage is different from the voltage polarity of the reset voltage. In the exemplary embodiment of the invention, the voltage value, voltage polarity and signal waveform of the set voltage, the reset voltage and the disturbance voltage are described in an exemplary sense only, which should not be construed as a limitation to the invention.

In summary, in the exemplary embodiments of the invention, the memory controlling circuit determines to apply the second set voltage or the second disturbance voltage according to the magnitude relationship between the reading current of the memory cell before/after the first disturbance voltage is applied. When the memory controlling circuit performs the set operation on the memory cell, the disturbance voltage can make the oxygen vacancy in the memory cell to be rearranged again such that the filament becomes robust, thereby maintaining the high temperature data retention of the memory storage apparatus and optimize the endurance of the memory storage apparatus.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A writing method of a resistive memory storage apparatus, comprising:
    applying a first set voltage on a memory cell, and acquiring a first reading current of the memory cell;
    applying a first disturbance voltage on the memory cell, and acquiring a second reading current of the memory cell; and
    determining to apply a second set voltage or a second disturbance voltage on the memory cell according to a magnitude relationship between the first reading current and the second reading current,
    wherein an absolute value of the first disturbance voltage is smaller than an absolute value of a reset voltage, and an absolute value of the second disturbance voltage is smaller than an absolute value of the second set voltage,
    wherein determining to apply the second set voltage or the second disturbance voltage on the memory cell according to the magnitude relationship between the first reading current and the second reading current comprises:
    if the second reading current is larger than or equal to the first reading current, applying the second disturbance voltage on the memory cell; and
    if the second reading current is smaller than the first reading current, applying the second set voltage on the memory cell and ending the writing method.

2. The writing method of the resistive memory storage apparatus according to claim 1, wherein a voltage polarity of the first disturbance voltage is the same as a voltage polarity of the reset voltage and different from a voltage polarity of the second set voltage, and a voltage polarity of the second disturbance voltage is the same as the voltage polarity of the second set voltage.

3. The writing method of the resistive memory storage apparatus according to claim 1, further comprising:
    acquiring a third reading current of the memory cell after the second disturbance voltage is applied on the memory cell; and
    determining whether the third reading current is larger than or equal to a first reference current, and determining whether to end the writing method or apply the reset voltage on the memory cell according to a determination result of the third reading current is larger than or equal to the first reference current.

4. The writing method of the resistive memory storage apparatus according to claim 3, wherein the step of determining whether to end the writing method or apply the reset voltage on the memory cell according to the determination result of the third reading current is larger than or equal to the first reference current comprises:
  if the third reading current is larger than or equal to the first reference current, ending the writing method; and
  if the third reading current is smaller than the first reference current, applying the reset voltage on the memory cell.

5. The writing method of the resistive memory storage apparatus according to claim 3, wherein a voltage polarity of the first disturbance voltage is the same as a voltage polarity of the reset voltage, and a voltage polarity of the second disturbance voltage is different from the voltage polarity of the reset voltage.

6. The writing method of the resistive memory storage apparatus according to claim 3, further comprising:
  after applying the first set voltage on the memory cell and acquiring the first reading current of the memory cell, determining whether the first reading current is larger than or equal to a second reference current, and determining to apply the first disturbance voltage or the reset voltage on the memory cell according to a determination result of the first reading current is larger than or equal to the second reference current,
  wherein the step of determining to apply the first disturbance voltage or the reset voltage on the memory cell according to the determination result of the first reading current is larger than or equal to the second reference current comprises:
    if the first reading current is larger than or equal to the second reference current, applying the first disturbance voltage on the memory cell; and
    if the first reading current is smaller than the second reference current, applying the reset voltage on the memory cell.

7. The writing method of the resistive memory storage apparatus according to claim 6, further comprising:
  before applying the first set voltage on the memory cell, set a voltage value of a third set voltage; and
  before applying the first set voltage on the memory cell, applying the third set voltage on the memory cell, and acquiring a fourth reading current of the memory cell.

8. The writing method of the resistive memory storage apparatus according to claim 7, further comprising:
  determining whether the fourth reading current is smaller than a third reference current, and determining to apply the first disturbance voltage on the memory cell or adjust the first set voltage before applying the first set voltage on the memory cell according to a determination result of the fourth reading current is smaller than the third reference current,
  wherein the step of determining whether to apply the first disturbance voltage on the memory cell or adjust the first set voltage before applying the first set voltage on the memory cell according to the determination result of the fourth reading current is smaller than the third reference current comprises:
    if the fourth reading current is smaller than the third reference current, adjusting the first set voltage before applying the first set voltage on the memory cell; and
    if the fourth reading current is larger than or equal to the third reference current, applying the first disturbance voltage on the memory cell.

9. The writing method of the resistive memory storage apparatus according to claim 7, further comprising:
  after applying the reset voltage on the memory cell, applying the third set voltage on the memory cell again.

10. A resistive memory storage apparatus, comprising:
  a memory cell array, comprising a memory cell; and
  a memory controlling circuit, coupled to the memory cell array, and the memory controlling circuit applying a first set voltage on the memory cell, and acquiring a first reading current of the memory cell, the memory controlling circuit applying a first disturbance voltage on the memory cell, and acquiring a second reading current of the memory cell, and the memory controlling circuit determining to apply a second set voltage or a second disturbance voltage on the memory cell according to a magnitude relationship between the first reading current and the second reading current, wherein an absolute value of the first disturbance voltage is smaller than an absolute value of a reset voltage, and an absolute value of the second disturbance voltage is smaller than an absolute value of the second set voltage,
  wherein if the second reading current is larger than or equal to the first reading current, the memory controlling circuit applies the second disturbance voltage on the memory cell, and if the second reading current is smaller than the first reading current, the memory controlling circuit applies the second set voltage on the memory cell and ends the writing method.

11. The resistive memory storage apparatus according to claim 10, wherein a voltage polarity of the first disturbance voltage is different from a voltage polarity of the second set voltage, and a voltage polarity of the second disturbance voltage is the same as a voltage polarity of the second set voltage.

12. The resistive memory storage apparatus according to claim 10, wherein after the second disturbance voltage is applied on the memory cell, the memory controlling circuit acquires a third reading current of the memory cell, and the memory controlling circuit determines whether the third reading current is larger than or equal to a first reference current, and determines whether to end the writing method or apply the reset voltage on the memory cell according to a determination result of the third reading current is larger than or equal to the first reference current.

13. The resistive memory storage apparatus according to claim 12, wherein if the third reading current is larger than or equal to the first reference current, the memory controlling circuit ends the writing method, and if the third reading current is smaller than the first reference current, the memory controlling circuit applies the reset voltage on the memory cell.

14. The resistive memory storage apparatus according to claim 12, wherein a voltage polarity of the first disturbance voltage is the same as a voltage polarity of the reset voltage, and a voltage polarity of the second disturbance voltage is different from the voltage polarity of the reset voltage.

15. The resistive memory storage apparatus according to claim 12, wherein after the first set voltage is applied on the memory cell and the first reading current of the memory cell is acquired, the memory controlling circuit determines whether the first reading current is larger than or equal to a second reference current, and determines to apply the first disturbance voltage or the reset voltage on the memory cell according to a determination result of the first reading current is larger than or equal to the second reference current, wherein if the first reading current is larger than or equal to the second reference current, the memory controlling circuit applies the first disturbance voltage on the memory cell, and if the first reading current is smaller than the second reference current, the memory controlling circuit applies the reset voltage on the memory cell.

16. The resistive memory storage apparatus according to claim 15, wherein before the first set voltage is applied on the memory cell, the memory controlling circuit sets a voltage value of a third set voltage, and before the first set voltage is applied on the memory cell, the memory controlling circuit applies the third set voltage on the memory cell and acquires a fourth reading current of the memory cell.

17. The resistive memory storage apparatus according to claim 16, wherein the memory controlling circuit determines whether the fourth reading current is smaller than a third reference current, and determines to apply the first disturbance voltage on the memory cell or adjust the first set voltage before applying the first set voltage on the memory cell according to a determination result of the fourth reading current is smaller than the third reference current, wherein if the fourth reading current is smaller than the third reference current, before the first set voltage is applied on the memory cell, the memory controlling circuit adjusts the first set voltage, and if the fourth reading current is larger than or equal to the third reference current, the memory controlling circuit applies the first disturbance voltage on the memory cell.

18. The resistive memory storage apparatus according to claim 16, wherein after the reset voltage is applied on the memory cell, the memory controlling circuit applies the third set voltage on the memory cell again.

\* \* \* \* \*